United States Patent [19]

Lam

[11] Patent Number: 5,311,082
[45] Date of Patent: May 10, 1994

[54] CMOS TO ECL LEVEL TRANSLATOR

[75] Inventor: NimCho Lam, Sunnyvale, Calif.

[73] Assignee: National Semiconductor Corporation, Santa Clara, Calif.

[21] Appl. No.: 810,769

[22] Filed: Dec. 17, 1991

[51] Int. Cl.⁵ ................. H03K 19/092; H03K 19/094
[52] U.S. Cl. .................................... 307/475; 307/451; 307/455
[58] Field of Search ......................... 307/475, 451, 455

[56] References Cited

U.S. PATENT DOCUMENTS

| | | | |
|---|---|---|---|
| 4,656,372 | 4/1987 | Sani et al. | 307/475 |
| 4,704,549 | 11/1987 | Sanwo et al. | 307/445 |
| 4,890,019 | 12/1989 | Hoyte et al. | 307/475 |
| 5,036,224 | 7/1991 | Wendell | 307/475 |
| 5,047,671 | 9/1991 | Suthar et al. | 307/475 |
| 5,101,123 | 3/1992 | Ten Eyck | 307/475 |

OTHER PUBLICATIONS

IEEE JSSC, vol. 25 No. 1, Feb. 1990, "High-Performance BiCMOS 100k-Gate Array", by Gallia et al.
"BiCMOS Technology and Applications" by Alvarez, 1989, '6.4.2 CMOS to ECL'.

Primary Examiner—Edward P. Westin
Assistant Examiner—Richard Roseen
Attorney, Agent, or Firm—Skjerven, Morrill, MacPherson, Franklin & Friel

[57] ABSTRACT

A low power CMOS to ECL level translator especially suitable for use as an output level translator includes a CMOS switch having a P-channel MOSFET transistor and an N-channel MOSFET transistor connected to CMOS voltage levels $V_{DD}$ and $V_{SS}$, an NPN bipolar transistor having a base connected to the output of the CMOS switch through an equalization circuit, a collector connected to ECL potential $V_{CC}$, and an emitter connected to an ECL potential $V_{EE}$. The ECL output is taken directly from the emitter of the bipolar transistor. The equalization circuit includes a PMOS transistor (or parallel transistor array if a greater size is needed) connected between $V_{CC}$ and the base of the bipolar transistor, the gate or gates thereof being connected to the output of the CMOS switch; and a second PMOS transistor connected between the base and emitter of the bipolar transistor, the gate thereof being connected to the DATA terminal. When the CMOS level is a logic zero, the equalization circuit isolates the base of the bipolar transistor from $V_{CC}$, and shorts the base and emitter of the bipolar transistor, effectively tristating the level translator while avoiding reverse-biasing the bipolar transistor. When the CMOS level is a logic one, the equalization circuit isolates the base from the emitter and raises the base toward $V_{CC}$, thereby driving the ECL output terminal. An enable circuit for the level translator also is described. The level transistor is suitable for use as an output translator, as an element of a bidirectional output translator, and when combined with a clamping circuit, as an internal level translator.

10 Claims, 3 Drawing Sheets

CMOS TO ECL LEVEL TRANSLATOR

BACKGROUND OF THE INVENTION

1. Field of the Invention

This invention relates to integrated circuit level translators, and more particularly to CMOS to ECL output level translators.

2. Description of Related Art

BiCMOS integrated circuits are suitable for applications requiring higher levels of performance than effectively achieved by traditional CMOS integrated circuits. For example, gate arrays incorporate BiCMOS buffers/drivers to maintain the density advantage of CMOS technology while providing the high drive capacity of bipolar technology. The BiCMOS technology allows designers to create fast ECL input/output ("I/O") circuits and high performance CMOS interfaces.

An example of a CMOS to ECL translator 100 is illustrated in FIG. 1. Transistors 112 and 114 are P-channel and N-channel CMOS transistors respectively, the gates of which share a common CMOS input 116. The drains of transistors 112 and 114 are connected to one another and to the base of an NPN transistor 122, which forms one typical branch of an ECL current switch 120. The other branch of the ECL current switch 120 is formed by NPN transistors 124 and 126, which have shorted collector-base junctions. The two branches of the ECL current switch 120 are connected to $V_{CC}$ 118 through respective resistors 123 and 127, and are connected to $V_{EE}$ through a current source 128. The level translator 100 is described in more detail in Alvarez, A.R., BiCMOS Technology and Applications, Kluwer Academic Publishers, Boston, 1989, page 218. The output 130, which is taken from the shorted collector-base of transistor 126, generally is applied to an emitter follower such as 140. A similar translator using an emitter follower driven by a reference voltage VCSB instead of the current source 128 is described in Gallia, James D. et al., "High-performance BiCMOS 100K-gate array," IEEE Journal of Solid State Circuits, Vol. 25, No. 1, February 1990, pp. 142–49.

For applications requiring a normal buffer, the low level on output line 130 is about minus 0.9 volts, which results in about minus 1.7 volts on the emitter of the bipolar buffer transistor 142. In other words, the buffer transistor 142 is never off, but instead is swing controlled. For bus driver applications requiring a cutoff buffer, the transistor 142 should be off when line 130 is low. In such applications, the value of impedance 152 of the bus 150 typically is fifty ohms, and the value of resistor 127 is chosen to ensure that the transistor 142 is off. A suitable output voltage on line 130 under these circumstances would be about minus 1.5 volts, for example.

Unfortunately, the power consumption of the CMOS to ECL translator of FIG. 1 is on the order of conventional ECL buffers. This level of power consumption is inconvenient for ECL LSI integrated circuits, and is excessive for BiCMOS VLSI integrated circuits.

SUMMARY OF THE INVENTION

The present invention provides effective translation of CMOS signal levels to ECL signal levels at a low level of power dissipation suitable for BiCMOS VLSI integrated circuits.

The present invention is particularly advantageous for applications of BiCMOS level translators requiring sufficient power to drive a data bus with relatively low average power dissipation.

In one embodiment of a level translator in accordance with the present invention, a CMOS buffer is connected to CMOS power buses and to a CMOS signal input. The output of the CMOS buffer is connected to the base of a bipolar transistor, the collector of which is connected to an ECL power bus, and the emitter of which is connected to an ECL signal output.

In a variation of the previous embodiment, the base of the bipolar transistor is connected to the output of the CMOS buffer through a switching circuit. The switching circuit is responsive to a CMOS logic level on the CMOS signal input. Upon the occurrence of a first CMOS logic level, the base of the bipolar transistor is isolated from the ECL power bus, and the emitter of the bipolar transistor is connected to the base of the bipolar transistor. Upon the occurrence of a second CMOS logic level on the CMOS signal input, the base of the bipolar transistor is connected to the ECL power bus and the emitter of the bipolar transistor is isolated from the base of the bipolar transistor.

BRIEF DESCRIPTION OF THE DRAWINGS

In the drawings, where like reference numerals indicate like parts.

DETAILED DESCRIPTION OF THE PREFERRED EMBODIMENT

Figure 1:
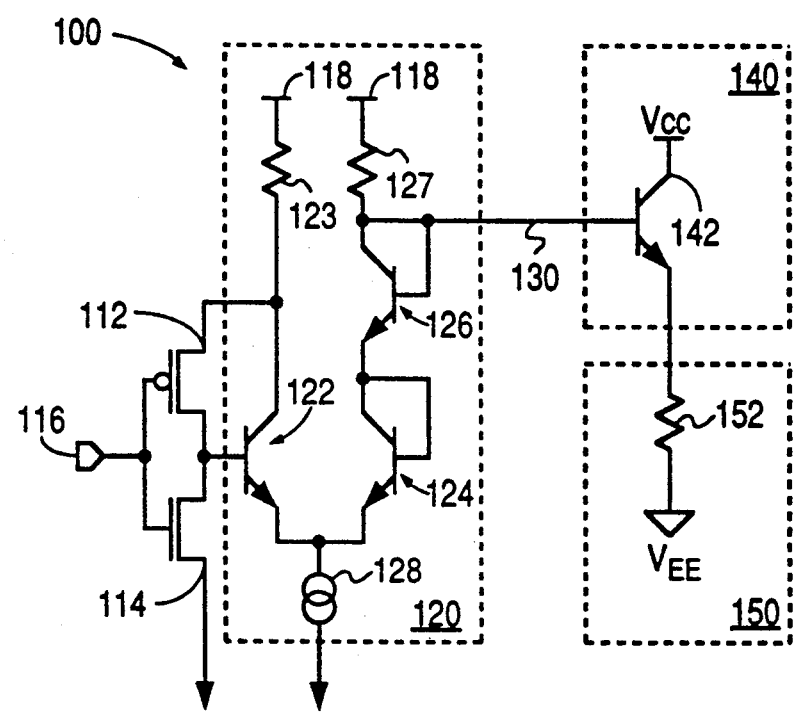
FIG. 1 is a circuit schematic diagram of a prior art CMOS to ECL level translator.
Figure 2:
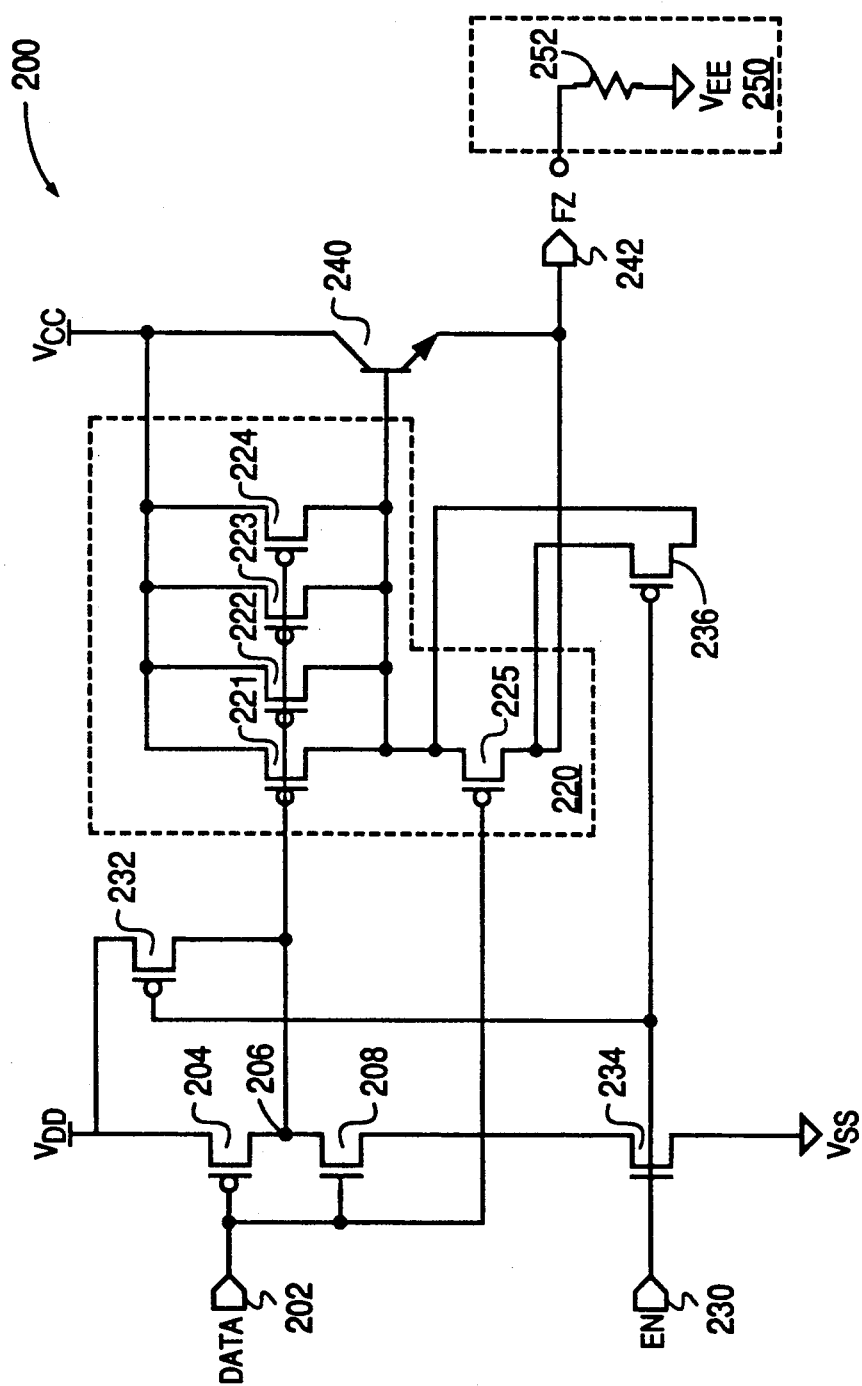
FIG. 2 is a circuit schematic diagram of a CMOS to ECL level translator in accordance with the present invention.

A low power CMOS to ECL output translator 200 is shown in FIG. 2. CMOS logic levels are applied to DATA input terminal 202, which is connected to the gates of a P-channel depletion mode MOSFET transistor 204 and a N-channel enhancement mode MOSFET transistor 208. CMOS power levels of, for example, zero volts and minus five volts are applied to nodes $V_{DD}$ and $V_{SS}$, respectively. The drains of MOSFET transistors 204 and 208 are commonly connected at node 206. The source of MOSFET transistor 204 is connected to node $V_{DD}$. The source of MOSFET transistor 208 is connected to node $V_{SS}$ through N-channel enable transistor 234.

An equalization circuit 220 includes four parallel-connected P-channel MOSFET transistors 221-224 having their gates connected to node 206, their sources connected to $V_{CC}$, and their drains connected to the base of an NPN bipolar transistor 240. The equalization circuit 220 also includes a P-channel MOSFET transistor 225 having its source connected to the base of the bipolar transistor 240, its drain connected to the emitter of the bipolar transistor 240, and its gate connected to the DATA input terminal 202.

The bipolar transistor 240 has a collector connected to $V_{CC}$ and an emitter connected to FZ output terminal 242. The output terminal 242 generally is connected to a bus 250, which has a characteristic impedance represented by resistor 252 connected to $V_{EE}$. The ECL power level represented by $V_{CC}$ and $V_{EE}$ is, for example, zero and minus two volts, respectively.

The transistors of circuit 200 are designed to have a suitable size, or channel width:length ratio. For example, a suitable size for the P-channel MOSFET transistors of circuit 200 is 40:1, and a suitable size for the N-channel MOSFET transistors of circuit 200 is 20:1. The size of the CMOS transistors 204, 208 and 234 set the input threshold of circuit 200. A suitable area for the bipolar transistor 240 is 1×4.8 microns square, which is selected for supplying good drive current with good speed and density.

The operation of circuit 200 is as follows, in which enable MOSFET transistors 232 and 236 are assumed to be off, and enable transistor 234 is assumed to be on. When DATA is a logic zero, about minus five volts is applied to the gates of MOSFET transistors 204 and 208. MOSFET transistors 204 and 208 turn on and off respectively, thereby driving node 206 high. In response, MOSFET transistors 221-224 of the equalization circuit 220 turn off, thereby isolating the base of the bipolar transistor 240 from $V_{CC}$. When DATA is a logic zero, about minus five volts is also applied to the gate of MOSFET transistor 225, thereby essentially shorting the base of bipolar transistor 240 to the emitter of the bipolar transistor 240. The bipolar transistor 240 is off, thereby avoiding any ECL power consumption and allowing output terminal 242 to float. The output voltage at terminal FZ, assuming no other load on bus 250, is about minus two volts.

When DATA is a logic one, about zero volts is applied to the gates of MOSFET transistors 204 and 208. MOSFET transistors 204 and 208 turn off and on respectively, thereby driving node 206 low. In response, MOSFET transistors 221-224 of the equalization circuit 220 turn on, thereby raising the base of the bipolar transistor 240 towards $V_{CC}$. When DATA is a logic one, about zero volts is also applied to the gate of MOSFET transistor 225, thereby essentially isolating the base of bipolar transistor 240 from the emitter of the bipolar transistor 240 and from the output terminal 242. The bipolar transistor 240 turns on, thereby driving the output terminal 242 high. The output voltage at terminal FZ, assuming that bus 250 has an impedance 252 of fifty ohms, is about minus 850 millivolts.

While the bipolar transistor 240 may be driven directly from node 206, such an arrangement would have a deleterious effect on bipolar transistor 240. When DATA is high, node 206 is driven towards $V_{SS}$, or minus five volts. Were node 206 directly connected to the base of the bipolar transistor 240, the p-n junction would be reverse-biased, since the emitter of bipolar transistor 240 is connected to $V_{EE}$, or minus two volts, through the impedance 252. Under this condition, the junction would be impacted by hot electrons, which would tend to degrade the junction over time.

The hot electron junction impact problem is avoided by use of the equalization circuit 220. When bipolar transistor 240 is off, the MOSFET transistor 225 is on to ensure that the base-emitter junction of the bipolar transistor 240 is not reverse-biased. The MOSFET transistors 221-224 are off to ensure that the base of the bipolar transistor 240 is not affected by the voltage level on node 206.

The circuit 200 includes an enable circuit comprising P-channel MOSFET transistors 232 and 236 and a N-channel MOSFET transistor 234. The gates of transistors 232, 234 and 236 are commonly connected to a CMOS level enable, or "EN," input terminal 230. In normal operation, the circuit 200 is enabled by application of zero volts, or a logic ONE, to EN terminal 230, which turns off enable MOSFET transistors 232 and 236, and turns on enable transistor 234. The circuit 200 is disabled, or tristated, by application of minus five volts, or a logic ZERO, to EN terminal 230. In this event, enable MOSFET transistor 234 turns off and enable MOSFET transistor 232 turns on to force node 206 HIGH, thereby isolating the base of bipolar transistor 240 from $V_{CC}$ by turning off MOSFET transistors 221-224 in the equalization circuit 220. At the same time, enable MOSFET transistor 236 turns on, thereby connecting the base and emitter of bipolar transistor 240 to one another and ensuring that the base-emitter junction of the bipolar transistor 240 is not reverse-biased.

Figure 3:
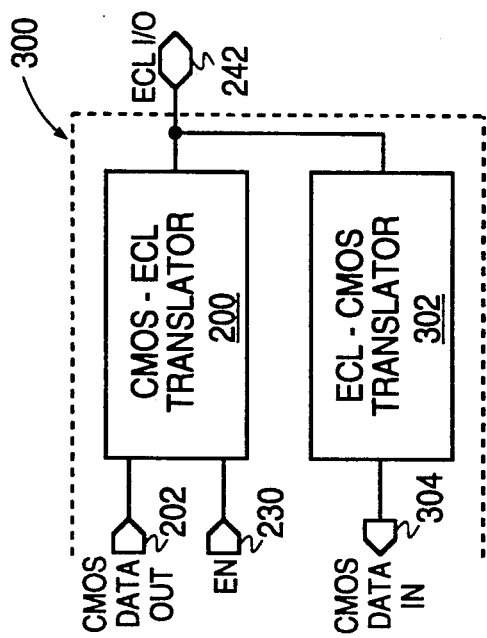
FIG. 3 is a circuit schematic diagram of a bidirectional level translator that incorporates the translator of FIG. 2.

A low power CMOS and ECL bidirectional level translator 300 is shown in FIG. 3. The translator 300 includes the CMOS to ECL level translator 200 in combination with a suitable ECL to CMOS level translator 302. Suitable ECL to CMOS translators are well known, and include the ECL to CMOS level translator described with reference to FIG. 9(a) of the previously mentioned Gallia et al. article, which hereby is incorporated herein by reference thereto.

The translator 300 is switched to output mode operation by applying zero volts, or a logic ONE, to EN terminal 230 which enables CMOS-ECL translator 200. The translator 300 is switched to input mode by applying minus five volts, or a logic zero, to EN terminal 230, which tristates CMOS-ECL translator 200.

Figure 4:
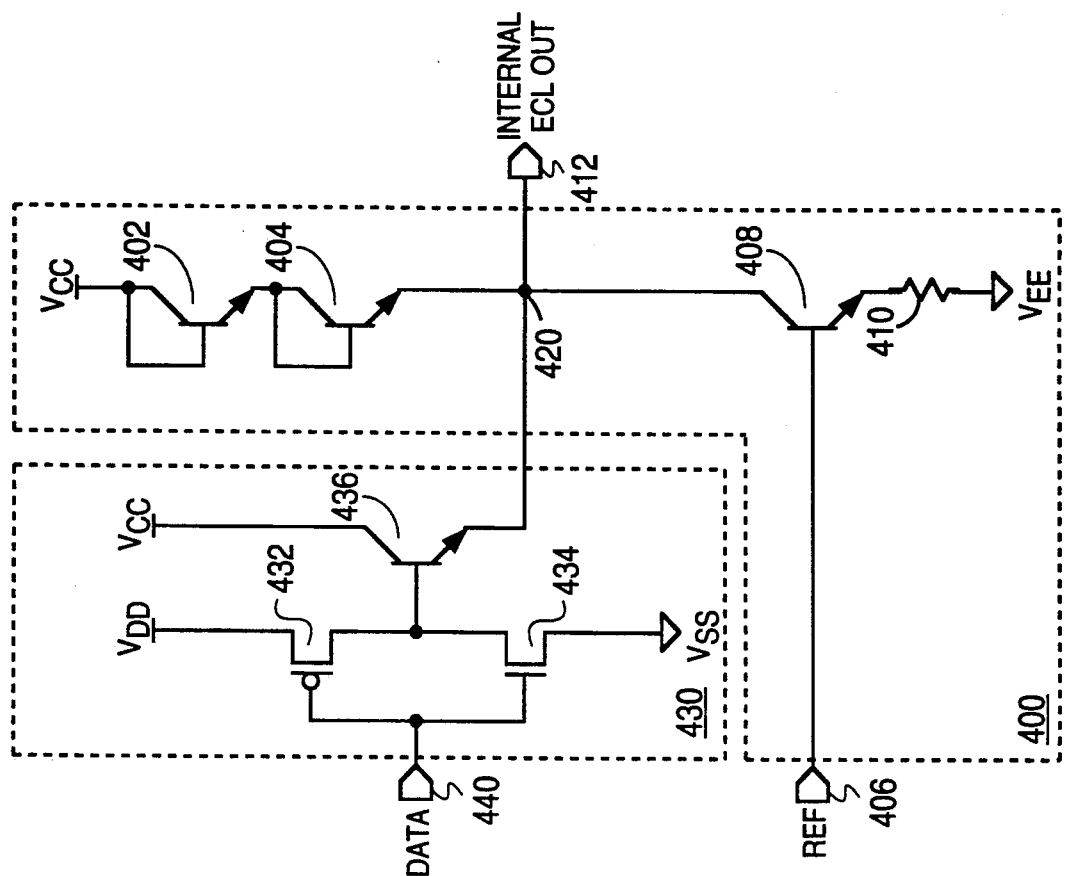
FIG. 4 is a circuit schematic diagram of an alternative termination for the level translator of FIG. 2.

While the translator 200 is particularly suitable for use as an output CMOS to ECL level translator, it may also be used as an internal CMOS to internal ECL converter when combined with a suitable voltage clamping circuit. A clamping circuit is used when ECL voltage buses are unavailable, as they may be in the core of a BiCMOS integrated circuit. A suitable voltage clamp 400 is shown in FIG. 4. The output 242 of the level translator 200 is connected to node 420 of the clamp 400. As the tristate function is not generally needed in internal translation, the translator 200 is maintained in an enabled condition by connecting EN terminal 230 to zero volts (logic ONE), or by omitting the enable transistors 232, 234 and 236. If enable transistor 234 is omitted from the translator 200, the source of transistor 208 is connected to $V_{SS}$.

A simplified translator 430 particularly suitable for use as an internal CMOS to internal ECL converter when combined with a suitable voltage clamping circuit such as voltage clamp 400 is shown in FIG. 4. CMOS logic levels are applied to DATA input terminal 440, which is connected to the gates of a P-channel MOSFET 432 and an N-channel MOSFET 434. CMOS power levels of, for example, zero volts and minus five volts ($V_{DD}$ and $V_{SS}$ respectively) are applied to the sources of MOSFET transistors 432 and 434 respectively. The drains of MOSFET transistors 432 and 434 are commonly connected to the base of an NPN bipolar transistor 436. The collector of transistor 436 is connected to $V_{CC}$, which has a value of zero volts. The emitter of transistor 436 is connected to node 420 in the voltage clamp 400.

The voltage clamping circuit 400 includes series-connected diodes 402 and 404 connected between the reference potential $V_{CC}$, to which the anode of diode 402 is connected, and node 420, to which the cathode of diode 404 is connected. The voltage clamping circuit 400 also includes a current source comprising an NPN bipolar transistor 408 and a resistor 410. The collector of the bipolar transistor 408 is connected to node 420, the emitter of the bipolar transistor 408 is connected to $V_{EE}$ through the resistor 410, and the base of transistor 166 is connected to a fixed reference potential 406. Reference potential 406 is obtained by any suitable circuit, such as a bandgap reference circuit. Suitable bandgap reference circuits are well known in the art. The node 420 to which the output of the CMOS-ECL translator 430 is connected to the voltage clamping circuit 400 is the internal ECL output node 412.

The operation of the translator 430 of FIG. 4 is similar to the operation of MOSFETs 204 and 208 and NPN transistor 240 in the level translator 200, except for the voltage at the emitter of transistor 436. When bipolar transistor 436 is on, current is conducted from bipolar transistor 436 through the transistor 408 and resistor 410. The potential phi appearing at node 420, which is essentially $V_{CC}$ minus "phi," the forward-biased voltage drop across the base-emitter junction of the bipolar transistor 436, is insufficient to forward bias diodes 402 and 404. Hence, diodes 402 and 404 do not conduct. In this embodiment, the value of phi is about 0.8 volts, so the value at the internal ECL output 412 is zero minus 0.8, or minus 0.8 volts. When bipolar transistor 436 is off, current from the diodes 402 and 404 is conducted through the bipolar transistor 408 and the resistor 410. As the voltage drop across each of the diodes 402 and 404 is also phi, the potential appearing at internal ECL output 412 is $V_{CC}$ minus two phi, or about minus 1.6 volts. These values are suitable internal ECL levels.

The transistors of circuits 400 and 430 are designed to have a suitable size, or channel width:length ratio. For example, in circuit 400, a suitable size for the bipolar transistor from which diode 402 is formed is 1×2 microns square, a suitable size for the bipolar transistor from which diode 404 is formed is 1×4.8 microns square, a suitable size for the bipolar transistor 408 is 2.4×5.4 microns square, and a suitable value for the resistor 410 is 1600 ohms. The reference potential of minus 3.7 volts is applied to reference terminal 406. In circuit 430, a suitable size for the NMOS transistor 434 is 20:1, a suitable size for the PMOS transistor 432 in 80:1 (4× for proper threshold control), and a suitable size for the NPN transistor 436 is 1×4.8 microns square.

The level translator 200 and variations thereof may be used in various applications and fabricated by various BiCMOS processes. One suitable BiCMOS process is the ABiC IV (TM) process, available from National Semiconductor Corporation, Mountain View, Calif.

While our invention has been described with respect to the embodiments set forth above, other embodiments and variations not described herein are within the scope of my invention. For example, our invention is not to be considered limited to the specific layout or process described, or limited to the ranges or specific values of individual devices specified, as specific parameter values depend on the characteristics desired of the integrated circuits in a manner well known in the art. Accordingly, other embodiments, variations and improvements not described herein are to be considered within the scope of our invention as defined by the following claims.

What is claimed is:

1. A level translator comprising:
first and second CMOS power buses;
a CMOS signal input;
a CMOS buffer connected to said CMOS power buses and said CMOS signal input and comprising a PMOS transistor having a gate connected to said CMOS input, a source connected to said first CMOS power bus, and a drain; and an NMOS transistor having a gate connected to said CMOS input, a source connected to said second CMOS power bus, and a drain;
an ECL power bus;
an ECL signal output;
an NPN bipolar transistor having a base connected to the drains of said PMOS and NMOS transistors, a collector connected to said ECL power bus, and an emitter connected to said ECL signal output;
an ECL signal input, said ECL signal output and said ECL signal input being a common ECL I/O terminal; and
an ECL to CMOS level translator having an input connected to said ECL I/O terminal and a CMOS signal output.

2. A level translator comprising:
first and second CMOS power buses;
a CMOS signal input;
a CMOS buffer connected to said CMOS power buses and said CMOS signal input and comprising a PMOS transistor having a gate connected to said CMOS input, a source connected to said first CMOS power bus, and a drain; and an NMOS transistor having a gate connected to said CMOS input, a source connected to said second CMOS power bus, and a drain;
an ECL power bus;
an ECL signal output;
an NPN bipolar transistor having a base connected to the drains of said PMOS and NMOS transistors, a collector connected to said ECL power bus, and an emitter connected to said ECL signal output;
a second ECL power bus;
a terminal for receiving a reference potential;
a second bipolar transistor having a collector to the emitter of said first bipolar transistor, a base connected to said reference potential terminal, and an emitter;
a resistor, the emitter of said second bipolar transistor being connected to said second ECL power bus through said resistor; and
first and second diodes, an anode of said first diode being connected to said first-mentioned ECL power bus, a cathode of said first diode being connected to an anode of said second diode, and a cathode of said second diode being connected to said ECL signal output.

3. A level translator, comprising: first and second CMOS power buses;
a CMOS signal input;
a CMOS buffer connected to said CMOS power buses and said CMOS signal input;
an ECL power bus;
an ECL signal output;
a bipolar transistor having a collector connected to said ECL power bus, an emitter connected to said ECL output, and a base; and
a switching circuit having an input coupled to an output of said CMOS buffer and responsive to a CMOS logic level on said CMOS signal input for isolating the base of said bipolar transistor from said ECL power bus and connecting the emitter of said bipolar transistor to the base of said bipolar transistor upon the occurrence of a first CMOS logic level on said CMOS signal input, and for connecting the base of said bipolar transistor to said ECL power bus and isolating the emitter of said bipolar transistor from the base of said bipolar transistor upon the occurrence of a second CMOS logic level on said CMOS signal input.

4. A level translator as in claim 3, wherein said switching circuit comprises:
- a first switch connected between said ECL power bus and the base of said bipolar transistor, and connected to the output of said CMOS buffer for responding to the CMOS logic level on said CMOS signal input to close upon the first CMOS logic level on said CMOS signal input, and to open upon the second CMOS logic level on said CMOS signal input; and
- a second CMOS switch connected between the base and the emitter of said bipolar transistor, and connected to the CMOS signal input for responding to the CMOS logic level on said CMOS signal input to open upon the first CMOS logic level on said CMOS signal input, and to close upon the second CMOS logic level on said CMOS signal input.

5. A level translator as in claim 3, wherein said CMOS buffer is an inverter, said switching circuit comprises:
- a first CMOS switch connected between said ECL power bus and the base of said bipolar transistor, a gate of said first CMOS switch being connected to an output of said CMOS inverter; and
- a second CMOS switch connected between the base and the emitter of said bipolar transistor, a gate of said second CMOS switch being connected to said CMOS signal input.

6. A circuit for translating a CMOS logic level to an ECL logic level, comprising:
- means for receiving said CMOS logic level;
- means for supplying an ECL potential;
- means for furnishing an ECL logic level;
- a bipolar transistor having a collector connected to said ECL potential supplying means, an emitter connected to said ECL logic level means, and a base; and
- means responsive to said CMOS logic level for isolating the base of said bipolar transistor from said ECL potential and connecting the emitter of said bipolar transistor to the base of said bipolar transistor upon the occurrence of a first CMOS logic level, and for connecting the base of said bipolar transistor to said ECL potential and isolating the emitter of said bipolar transistor from the base of said bipolar transistor upon the occurrence of a second CMOS logic level.

7. A CMOS to ECL level translator circuit, comprising:
- a CMOS input terminal;
- a first PMOS transistor having a source connected to $V_{DD}$ and a drain connected to a common node;
- a first NMOS transistor having a source connected to $V_{SS}$ and a drain connected to said common node;
- an ECL output terminal;
- an NPN transistor having a base, a collector connected to $V_{CC}$, and an emitter connected to said ECL output terminal;
- a second PMOS transistor having a source connected to $V_{CC}$, a drain connected to the base of said NPN transistor, and a gate connected to said common node; and
- a third PMOS transistor having a source connected to the base of said NPN transistor, a drain connected to the emitter of said NPN transistor, and a gate connected to said CMOS input terminal.

8. A circuit as in claim 7, further comprising:
first and second series-connected diodes connected between $V_{CC}$ and said ECL output terminal; and a current source connected to said ECL output terminal.

9. A circuit as in claim 8, wherein said current source comprises:
- a resistor;
- a source of reference potential; and
- a second NPN transistor having a collector connected to said ECL output terminal, an emitter connected to $V_{EE}$ through said resistor, and a base connected to said source of reference potential.

10. A circuit as in claim 7, further comprising:
- an enable terminal;
- a second NMOS transistor connected between said first-mentioned NMOS transistor and $V_{SS}$, said second NMOS transistor having a gate connected to said enable terminal;
- a fourth PMOS transistor connected between said common terminal and $V_{DD}$, said fourth PMOS transistor having a gate connected to said enable terminal; and
- a fifth PMOS transistor connected between the base and emitter of said NPN transistor, said fifth PMOS transistor having a gate connected to said enable terminal.

* * * * *